(12) United States Patent
Chen et al.

(10) Patent No.: US 12,261,589 B2
(45) Date of Patent: Mar. 25, 2025

(54) MULTIPLEXER WITH ACOUSTIC WAVE FILTERS AND TRAP CIRCUIT

(71) Applicant: Skyworks Solutions, Inc., Irvine, CA (US)

(72) Inventors: Li Chen, Irvine, CA (US); Xianyi Li, Irvine, CA (US); Zhi Shen, Aliso Viejo, CA (US); Renfeng Jin, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 357 days.

(21) Appl. No.: 17/808,466

(22) Filed: Jun. 23, 2022

(65) Prior Publication Data

US 2023/0006648 A1 Jan. 5, 2023

Related U.S. Application Data

(60) Provisional application No. 63/216,802, filed on Jun. 30, 2021, provisional application No. 63/216,804, filed on Jun. 30, 2021.

(51) Int. Cl.
| | |
|---|---|
| *H04B 1/00* | (2006.01) |
| *H03H 9/56* | (2006.01) |
| *H03H 9/64* | (2006.01) |
| *H03H 9/70* | (2006.01) |
| *H03H 9/72* | (2006.01) |
| *H04B 1/40* | (2015.01) |

(52) U.S. Cl.
CPC .......... *H03H 9/568* (2013.01); *H03H 9/6483* (2013.01); *H03H 9/70* (2013.01); *H03H 9/72* (2013.01); *H04B 1/40* (2013.01)

(58) Field of Classification Search
CPC ........ H03H 9/568; H03H 9/6483; H03H 9/70; H03H 9/72; H03H 9/542; H03H 9/605; H03H 9/706; H03H 9/725; H04B 1/40
See application file for complete search history.

(56) References Cited

U.S. PATENT DOCUMENTS

| | | | |
|---|---|---|---|
| 10,560,867 B2 | 2/2020 | Khlat et al. | |
| 10,903,818 B2 | 1/2021 | Nair et al. | |
| 12,028,050 B1* | 7/2024 | Stokes | H03H 9/205 |
| 2007/0052499 A1 | 3/2007 | Tani | |
| 2008/0169886 A1 | 7/2008 | Kuroda | |
| 2008/0224799 A1 | 9/2008 | Taniguchi | |
| 2015/0295559 A1* | 10/2015 | White | H03H 9/542 333/133 |
| 2018/0041194 A1* | 2/2018 | Ito | H03H 9/542 |

(Continued)

OTHER PUBLICATIONS

U.S. Appl. No. 17/808,407, filed Jun. 23, 2022, Multiplexer With Acoustic Assisted Trap Circuit.

*Primary Examiner* — Ping Y Hsieh
(74) *Attorney, Agent, or Firm* — Knobbe, Martens, Olson & Bear, LLP

(57) ABSTRACT

Aspects of this disclosure relate to a multiplexer with an acoustic assisted trap circuit. The multiplexer includes a first acoustic wave filter and a second acoustic wave filter. The first acoustic wave filter can include a bulk acoustic wave resonator. The second acoustic wave filter can include a surface acoustic wave resonator and an impedance network. The surface acoustic wave resonator and the impedance network can together provide a trap for a harmonic associated with the first acoustic wave filter.

20 Claims, 12 Drawing Sheets

(56) References Cited

U.S. PATENT DOCUMENTS

| | | |
|---|---|---|
| 2020/0014370 A1 | 1/2020 | Matsubara et al. |
| 2020/0212884 A1* | 7/2020 | Shin .................. H03H 9/56 |
| 2020/0321941 A1 | 10/2020 | Genji |
| 2021/0143795 A1* | 5/2021 | Azizi .................. H04B 1/12 |
| 2021/0184706 A1 | 6/2021 | Hisano et al. |
| 2021/0399750 A1 | 12/2021 | Varela Campelo |
| 2023/0006651 A1 | 1/2023 | Chen et al. |

* cited by examiner

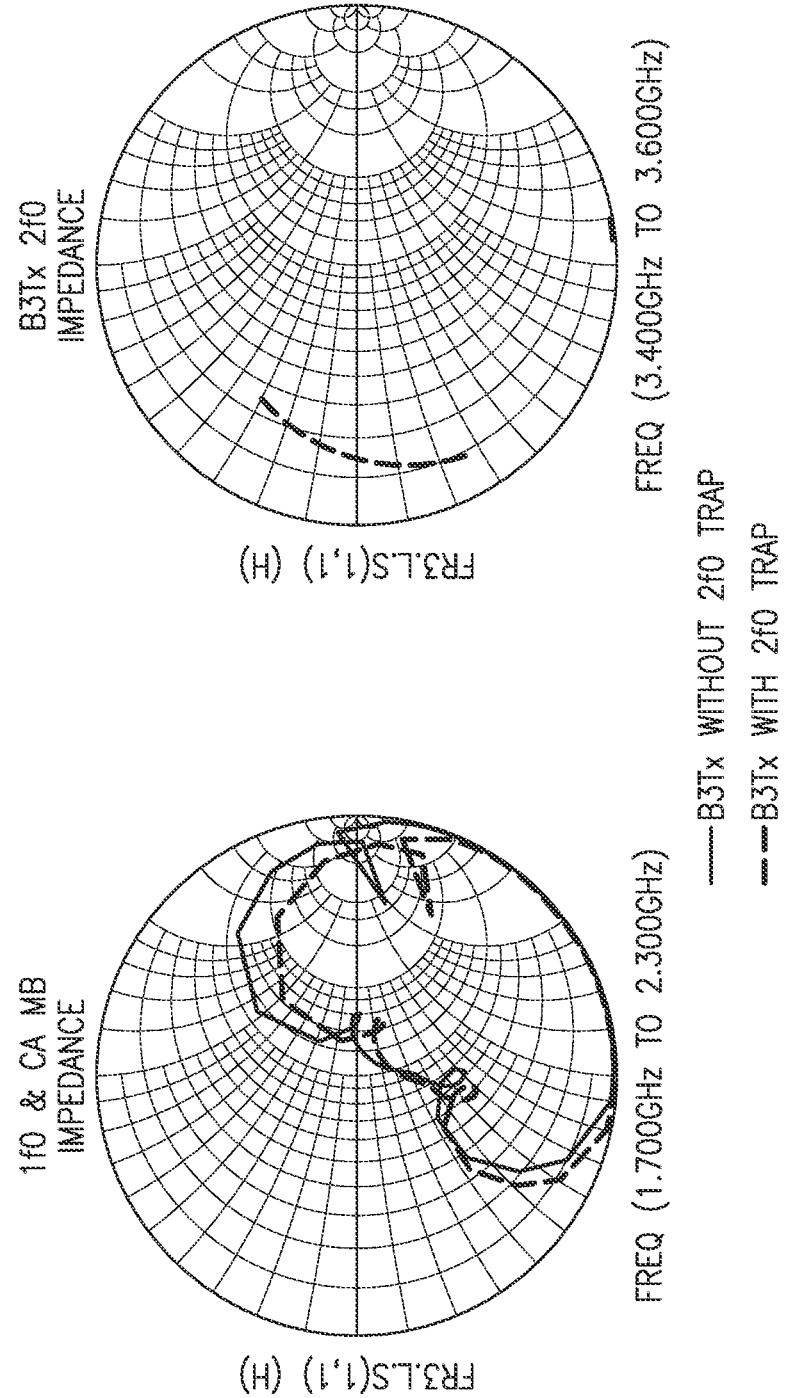

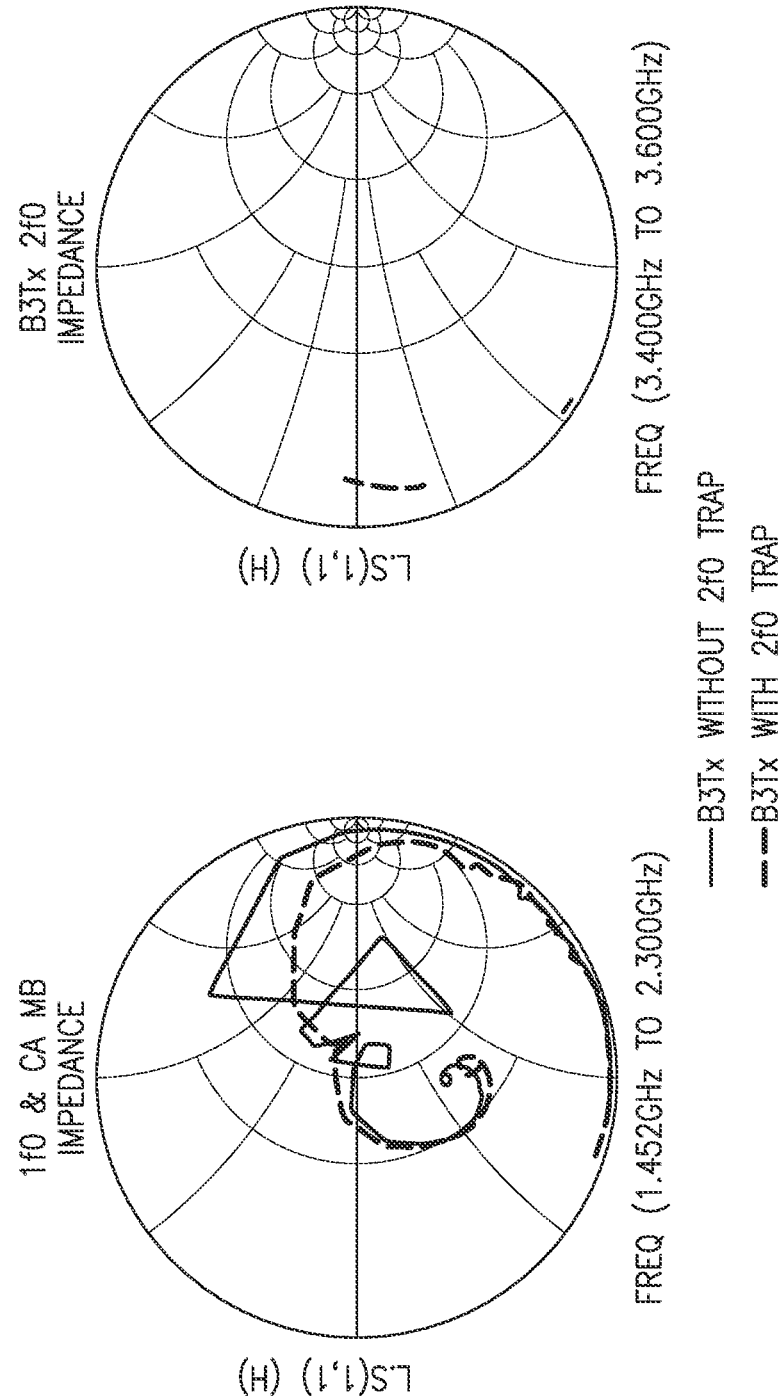

MULTIPLEXER WITH ACOUSTIC WAVE FILTERS AND TRAP CIRCUIT

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/216,802, filed Jun. 30, 2021 and titled "MULTIPLEXER WITH ACOUSTIC ASSISTED TRAP CIRCUIT," and U.S. Provisional Application No. 63/216,804, filed Jun. 30, 2021 and titled "MULTIPLEXER WITH ACOUSTIC WAVE FILTERS AND TRAP CIRCUIT," the disclosures of each of which are hereby incorporated by reference in their entireties and for all purposes.

BACKGROUND

Technical Field

Embodiments of this disclosure relate to filters and harmonic trap circuits in radio frequency systems.

Description of Related Technology

An acoustic wave filter can include a plurality of acoustic wave resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). SAW filters include SAW resonators. Example SAW resonators include temperature compensated SAW resonators, non-temperature compensated SAW resonators, and multilayer piezoelectric substrate (MPS) SAW resonators.

Acoustic wave filters can be implemented in radio frequency electronic systems. For instance, filters in a radio frequency front end of a mobile phone can include acoustic wave filters. An acoustic wave filter can be a band pass filter or a band stop filter. A plurality of acoustic wave filters can be arranged as a multiplexer. For example, two acoustic wave filters can be arranged as a duplexer. Acoustic wave filters can generate harmonic distortion. Suppressing such harmonic distortion can be challenging. There are also technical challenges associated with meeting system level linearity specifications.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a multiplexer with an acoustic assisted trap circuit. The multiplexer includes a first acoustic wave filter and a plurality of additional acoustic wave filters coupled together with the first acoustic wave filter at an antenna node. The plurality of additional acoustic wave filters includes a second acoustic wave filter that includes an acoustic wave resonator and an impedance network that are together configured to provide a trap for a harmonic associated with the first acoustic wave filter. The second acoustic wave filter has an edge of a passband that is farther from the harmonic associated with the first acoustic wave filter than any other filter of the plurality of additional acoustic wave filters.

The impedance network can include an inductor. The acoustic wave resonator can be a shunt resonator that is in series with the inductor. The impedance network can consist of the inductor. The acoustic wave resonator can be a first acoustic wave resonator of the second acoustic wave filter from the antenna node. The second acoustic wave filter can include a series acoustic wave resonator coupled between the acoustic wave resonator and the antenna node. The inductor can be on a same die as the acoustic wave resonator.

The first acoustic wave filter can be a transmit filter, and the second acoustic wave filter can be a receive filter. The first acoustic wave filter can be a transmit filter, and the second acoustic wave filter can be a transmit filter. The first acoustic wave filter and the second acoustic wave filter can both be band pass filters associated with different frequency bands.

The acoustic wave resonator can be a temperature compensated surface acoustic wave resonator. The acoustic wave resonator can be a bulk acoustic wave resonator.

The plurality of additional acoustic wave filters can include a third acoustic wave filter, where the third acoustic wave filter includes a second acoustic assisted trap circuit. The plurality of additional acoustic wave filters can include at least three acoustic wave filters, where the at least three acoustic wave filters include the second acoustic wave filter.

The harmonic can be a second harmonic. The multiplexer is included in a radio frequency system that achieves less than −90 dBc for the harmonic.

Another aspect of this disclosure is a wireless communication device that includes a power amplifier, an antenna, an antenna switch connected to the antenna switch, and a multiplexer. The multiplexer includes a first acoustic wave filter in a signal path between the power amplifier and the antenna switch, a second acoustic wave filter, and a third acoustic wave filter. The second acoustic wave filter includes an acoustic wave resonator and an impedance network that are together configured to provide a trap for a harmonic associated with the first acoustic wave filter. The second acoustic wave filter has a passband with an edge that is farther from the harmonic associated with the first acoustic wave filter than a corresponding edge of a passband of the third acoustic wave filter.

The wireless communication device can include a low noise amplifier. The second acoustic wave filter can be in a signal path between the low noise amplifier and the antenna switch.

The wireless communication device can achieve less than −90 dBc for the harmonic at an antenna side node of the antenna switch.

Another aspect of this disclosure is a method of radio frequency filtering. The method includes filtering a radio frequency signal with a first acoustic wave filter of a multiplexer. The multiplexer also includes a second acoustic wave filter and one or more other acoustic wave filters. While performing said filtering, the method includes trapping a harmonic associated with the first acoustic wave filter with an acoustic assisted trap circuit of the second acoustic wave filter of the multiplexer. The acoustic assisted trap circuit includes an acoustic wave resonator and an inductor. The second acoustic wave filter has an edge of a passband that is farther from the harmonic than any of the one or more other acoustic wave filters.

Another aspect of this disclosure is a multiplexer with an acoustic assisted trap circuit. The multiplexer includes a first acoustic wave filter and a second acoustic wave filter coupled to the first acoustic wave filter. The first acoustic wave filter includes a bulk acoustic wave resonator. The second acoustic wave filter includes a surface acoustic wave resonator and an impedance network. The surface acoustic wave resonator and the impedance network are together configured to provide a trap for a harmonic associated with the first acoustic wave filter.

The surface acoustic wave resonator can be a temperature compensated surface acoustic wave resonator.

The impedance network can include an inductor. The surface acoustic wave resonator can be a shunt resonator in series with the inductor. The surface acoustic wave resonator can be a first acoustic wave resonator of the second acoustic wave filter from a common node at which the first acoustic wave filter is coupled to the second acoustic wave filter. The second acoustic wave filter can include a series acoustic wave resonator coupled between the surface acoustic wave resonator and a common node at which the first acoustic wave filter is coupled to the second acoustic wave filter. The inductor can be on a same die as the surface acoustic wave resonator.

The first acoustic wave filter can be a transmit filter, and the second acoustic wave filter can be a receive filter. The first acoustic wave filter can be a transmit filter, and the second acoustic wave filter can be a transmit filter.

The first acoustic wave filter and the second acoustic wave filter can both be band pass filters, and the first acoustic wave filter and the second acoustic wave filter can be associated with different frequency bands.

The multiplexer can include a plurality of additional acoustic wave filters coupled to the first and second acoustic wave filters at a common node. The second acoustic wave filter can be associated with a fundamental frequency that is farther from the harmonic than a respective fundamental frequency associated with any of the plurality of additional acoustic wave filters.

The harmonic can be a second harmonic. The multiplexer can be included in a radio frequency system that achieves −90 dBc or less for the harmonic.

Another aspect of this disclosure is a radio frequency system that includes a power amplifier, an antenna switch, and a multiplexer including a first acoustic wave filter and a second acoustic wave filter coupled to the first acoustic wave filter. The first acoustic wave filter includes a bulk acoustic wave resonator. The second acoustic wave filter includes a surface acoustic wave resonator and an impedance network. The surface acoustic wave resonator and the impedance network are together configured to provide a trap for a harmonic associated with the first acoustic wave filter. The first acoustic wave filter is in a signal path between the power amplifier and the antenna switch.

The radio frequency system can include a low noise amplifier. The second acoustic wave filter can be in a signal path between the low noise amplifier and the antenna switch.

The second acoustic wave filter can be a transmit filter.

The radio frequency system can be configured to achieve less than −90 dBc for the harmonic at an antenna side node of the antenna switch.

Another aspect of this disclosure is a wireless communication device that includes a multiplexer and an antenna operatively coupled to the multiplexer. The multiplexer includes a first acoustic wave filter and a second acoustic wave filter coupled to the first acoustic wave filter. The first acoustic wave filter includes a bulk acoustic wave resonator. The second acoustic wave filter includes a surface acoustic wave resonator and an impedance network. The surface acoustic wave resonator and the impedance network are together configured to provide a trap for a harmonic associated with the first acoustic wave filter.

The wireless communication device can include a power amplifier, and the first acoustic wave filter can filter a radio frequency signal generated by the power amplifier. The wireless communication device can be a mobile phone.

Another aspect of this disclosure is a radio frequency system that includes a first acoustic wave filter, a plurality of additional acoustic wave filters coupled together with the first acoustic wave filter at a common node, a trap circuit coupled to the common node, and an antenna switch configured to selectively electrically connect the common node to an antenna node. The trap circuit includes an inductor and a capacitor. The trap circuit is configured to provide a trap for a harmonic associated with the first acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/808,407, titled "MULTIPLEXER WITH ACOUSTIC ASSISTED TRAP CIRCUIT," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIGS. 6A and 6B are Smith charts associated with the radio frequency system of FIG. 5.

FIGS. 9A and 9B are Smith charts associated with the radio frequency system of FIG. 8.

DETAILED DESCRIPTION OF CERTAIN EMBODIMENTS

Figure 1A:
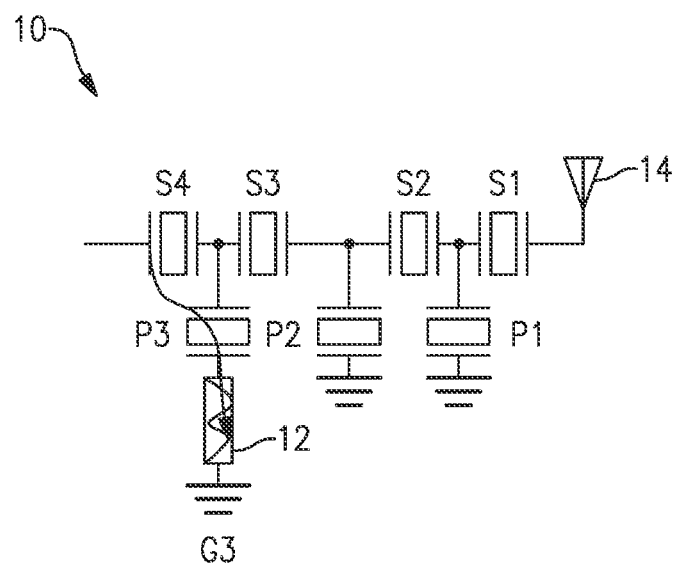
FIGS. 1A, 1B, 1C, and 1D are schematic diagrams associated with acoustic wave filters and trap circuits.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain system level linearity specifications have stringent second order harmonic emissions (H2) specifications. As one example, a stringent specification can be that a radio frequency system achieves H2 of less than −90 decibels relative to the carrier (dBc). In bulk acoustic wave (BAW) filters, H2 emission can be generated from a main mode, a lateral mode, a recessed frame a mode, the like, or any suitable combination thereof. Even with techniques to reduce H2 emissions from BAW resonators, such as BAW resonator splits and/or cancellation, additional H2 reduction can be desired to meet certain system level H2 specifications. With post filter matching and a post antenna switch second harmonic trap circuit, H2 can be further reduced after the BAW filter. However, such post filter further reductions together with the techniques to reduce H2 emissions from BAW resonators can still be 10 dB to 15 dB short of meeting certain system level H2 emissions. This disclosure provides technical solutions related to providing an additional H2 emission reduction. With techniques disclosed herein, a radio frequency system can meet stringent H2 specifications, such as achieving H2 of less than −90 dBc.

Aspects of this disclosure relate to a circuit topology to reduce acoustic wave filter harmonic distortion by using a trap circuit that includes an acoustic wave resonator and an inductor. H2 can be a bottleneck for a power amplifier with duplexer module, especially when it covers multiple bands and wide frequencies. By designing a harmonic short circuit at an antenna side, a trap at a second harmonic (2fo) frequency can be formed to help reject power generated by an acoustic filter at the second harmonic. An acoustic assisted trap circuit can include a shunt resonator of one acoustic wave filter of a multiplexer in series with an inductor, and the acoustic assisted trap circuit can provide H2 rejection for another filter of the multiplexer.

Inductor-capacitor (LC) trap circuits at an antenna side can reject H2. Such LC trap circuits can add costs by using extra surface mount devices (SMDs). LC trap circuits can also consume area on a module. Steepness of a frequency response of such an LC trap circuit may not be sufficient such that there is a loss tradeoff.

This disclosure provides technical solutions that use an acoustic assisted trap circuit to achieve better steepness for the trap than certain LC trap circuits. Also, for a multiplexer with multiple filters ganged and/or switch-plexed together, acoustic wave resonators can be on a separate filter die so that acoustic resonator based trap circuits do not add significant area to a module. By using an acoustic assisted trap, acoustic wave resonators can be implemented on filter dies to avoid using extra SMD components for such trap circuits. In some instances, inductor(s) of acoustic trap circuit(s) can also be formed on one or more of the filter dies. Due to better steepness from acoustic wave resonance, a sufficiently deep trap can be formed while reducing the loss penalty on carrier aggregation bands. H2 improvement has been confirmed by multiple simulations.

In an embodiment, a multiplexer with an acoustic assisted trap circuit includes a first acoustic wave filter and a second acoustic wave filter coupled to the first acoustic wave filter. The first acoustic wave filter includes a bulk acoustic wave resonator. The second acoustic wave filter includes a surface acoustic wave resonator and an inductor that are together configured to provide a trap for a harmonic associated with the first acoustic wave filter.

According to an embodiment, a multiplexer includes an acoustic assisted trap circuit. The multiplexer includes a first acoustic wave filter and a plurality of additional acoustic wave filters coupled together with the first acoustic wave filter at an antenna node. The plurality of additional acoustic wave filters includes a second acoustic wave filter that includes an acoustic wave resonator and an inductor that are together configured to provide a trap for a harmonic associated with the first acoustic wave filter. The second acoustic wave filter has a fundamental frequency that is farther from the harmonic associated with the first acoustic wave filter than any other filter of the plurality of additional acoustic wave filters. The second acoustic wave filter has a band edge in the frequency domain that is farther from the harmonic associated with the first acoustic wave filter than any other filter of the plurality of additional acoustic wave filters.

A harmonic trap circuit can provide a short circuit to ground at a harmonic frequency. The harmonic trap circuit can be effective when the harmonic trap circuit is at the same side as an antenna load relative to a non-linear source. FIGS. 1A, 1B, 1C, and 1D are schematic diagrams associated with acoustic wave filters and trap circuits.

FIG. 1A is a schematic diagram that illustrates an acoustic wave filter 10 with a harmonic trap circuit. The acoustic wave filter 10 includes series acoustic wave resonators S1, S2, S3, and S4, shunt acoustic wave resonators P1, P2, and P3, and an impedance network 12. The impedance network 12 can be or include an inductor. The acoustic wave filter 10 is electrically connected to an antenna 14. Ground node G3 can trap harmonics generated by acoustic wave resonators S4 and P3. For example, H2 generated by series acoustic wave resonator S4 can be shorted to group by shunt acoustic wave resonator P3 and impedance network 12 having suitable impedance values that together short the second harmonic generated by the series acoustic wave resonator S4 to ground.

Figure 1B:
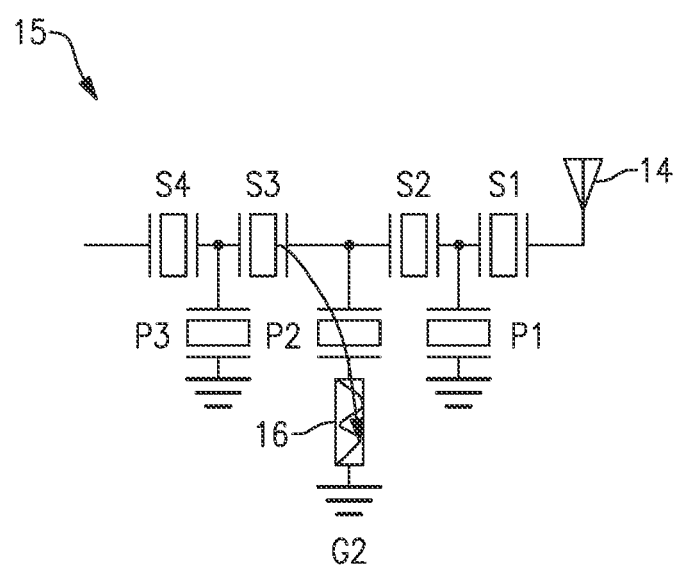

FIG. 1B is a schematic diagram that illustrates an acoustic wave filter 15 with a harmonic trap circuit. In the acoustic wave filter 15, the harmonic trap circuit is located at a different location in the filter topology than in the acoustic wave filter 10. Ground node G2 can trap harmonics generated by acoustic wave resonators S3, S4, P2, and P3. Impedance network 16 can have a suitable impedance for implementing a harmonic trap together with the shunt acoustic wave resonator P2.

Figure 1C:
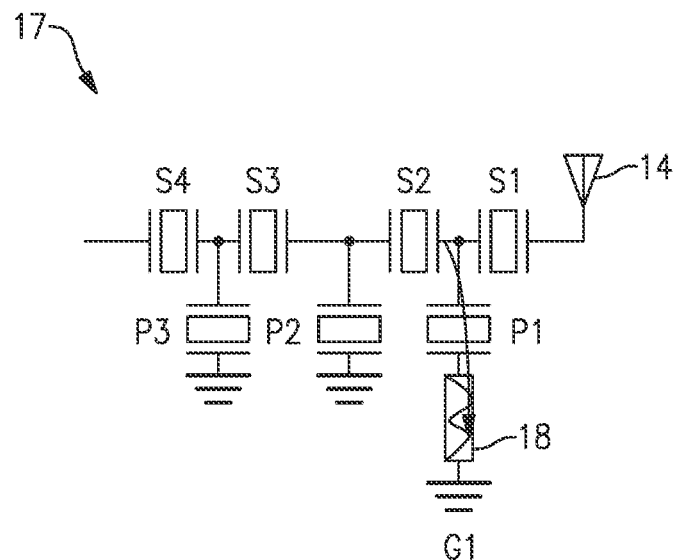

FIG. 1C is a schematic diagram that illustrates an acoustic wave filter 17 with a harmonic trap circuit. In the acoustic wave filter 17, the harmonic trap circuit is located at a different location in the filter topology than in the acoustic wave filter 15. Ground node G1 can trap harmonics generated by acoustic wave resonators S2, S3, S4, P1, P2, and P3. Impedance network 18 can have a suitable impedance for implementing a harmonic trap together with the shunt acoustic wave resonator P1.

Figure 1D:
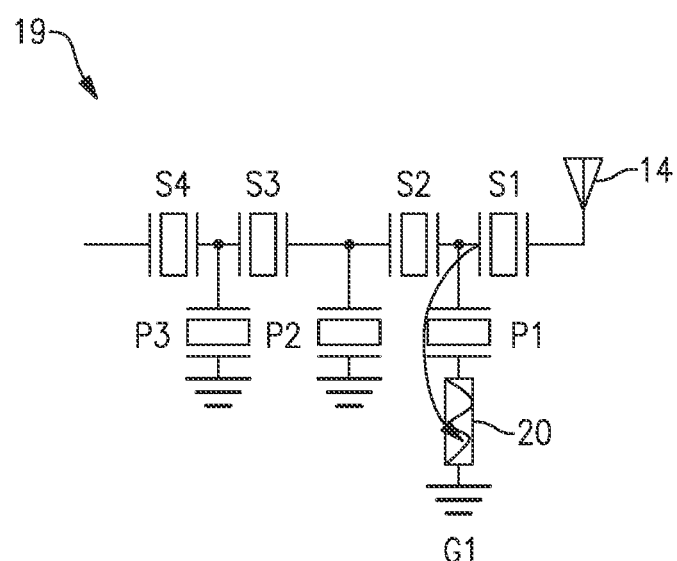

FIG. 1D is a schematic diagram that illustrates an acoustic wave filter 19 with a harmonic trap circuit. The harmonic trap circuit that includes impedance network 20 is not effective at trapping H2 generated by acoustic wave resonators S1 and P1 of the acoustic wave filter 19. Generally, when a harmonic trap circuit is at a different side than an antenna 14 relative to a non-linear source, the harmonic trap circuit may not be effective at reducing H2 associated with the non-linear source.

Figure 2:
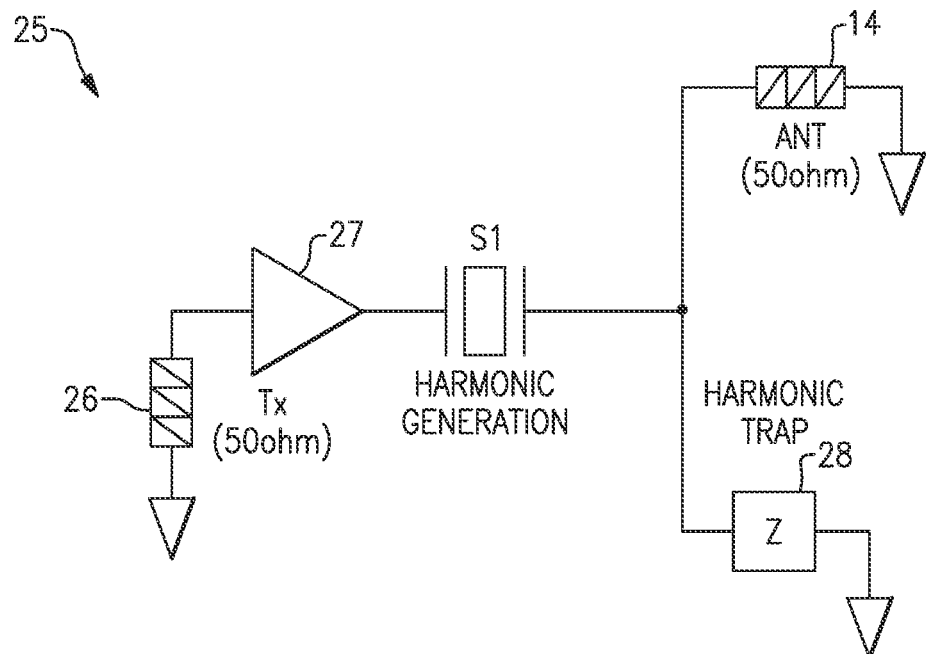
FIG. 2 is a schematic diagram that includes a trap circuit for suppressing a harmonic generated by an acoustic wave resonator.
Figure 3:
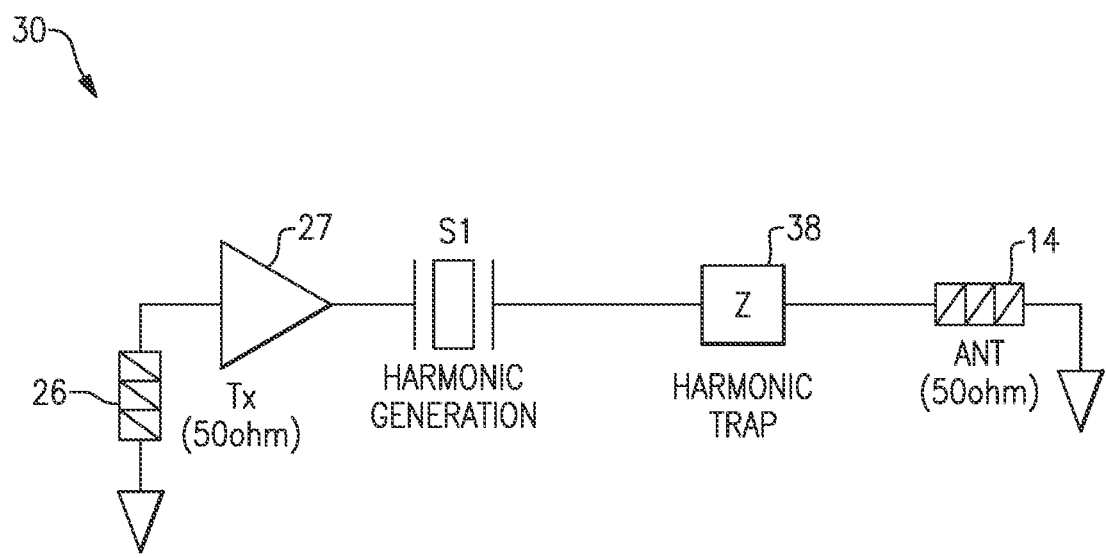
FIG. 3 is a schematic diagram that includes another trap circuit for suppressing a harmonic generated by an acoustic wave resonator.

FIGS. 2 and 3 relate to example harmonic trap circuits that can reduce harmonics generated by acoustic wave resonators. With harmonic trap circuits, trapping more power associated with a harmonic and providing less power associated with the harmonic to an antenna is generally desirable.

FIG. 2 is a schematic diagram of a radio frequency system 25 that includes a harmonic trap circuit 28 for suppressing a harmonic generated by an acoustic wave resonator S1. The acoustic wave resonator Si can be the first series acoustic wave resonator of an acoustic wave filter from the antenna 14. The radio frequency system 25 includes a power amplifier 27 with an input load 26, a series acoustic wave resonator S1, a harmonic trap circuit 28, and an antenna 14. The input load 26 can have an impedance of 50 Ohms, for example. The antenna 14 can have an impedance of 50 Ohms, for example. The series acoustic wave resonator S1 can be included in a ladder filter that includes a plurality of series acoustic wave resonators and a plurality of shunt acoustic wave resonators.

The harmonic trap circuit 28 is a shunt trap circuit. The harmonic trap circuit 28 can provide an impedance of approximately zero at a second harmonic of the series acoustic wave resonator S1 and also provide a high impedance or open circuit at a fundamental frequency of the series acoustic wave resonator S1. The second harmonic is typically at two times the fundamental frequency of the series acoustic wave resonator S1. In certain embodiments, the harmonic trap circuit 28 can include a shunt acoustic wave resonator in series with an inductor. Such a harmonic trap circuit can be included in a different filter of a multiplexer than a filter that include the series acoustic wave resonator S1. A harmonic trap circuit that includes an acoustic wave resonator can be referred to as an acoustic assisted trap circuit. For acoustic assisted trap circuits, an acoustic wave resonator of the trap circuit can be implemented on a different die than the series acoustic wave resonator S1. This can be due to differences in the acoustic wave resonator stacks and/or resonant frequencies.

FIG. 3 is a schematic diagram that includes a harmonic trap circuit 38 for suppressing a harmonic generated by an acoustic wave resonator. The radio frequency system 30 includes a power amplifier 27 with an input load 26, a series acoustic wave resonator S1, a harmonic trap circuit 38, and an antenna 14. The harmonic trap circuit 38 is a series trap circuit. The harmonic trap circuit 38 can provide high impedance at a second harmonic of the series acoustic wave resonator S1. In certain embodiments, the harmonic trap circuit 38 can include a series acoustic wave resonator in parallel with an inductor. Such a harmonic trap circuit can be included in a different filter of a multiplexer than a filter that includes the series acoustic wave resonator S1. A series acoustic wave resonator of the acoustic assisted trap circuit can be implemented on a different die than the series acoustic wave resonator S1. This can be due to differences in the acoustic wave resonator stacks and/or resonant frequencies.

Figure 4:
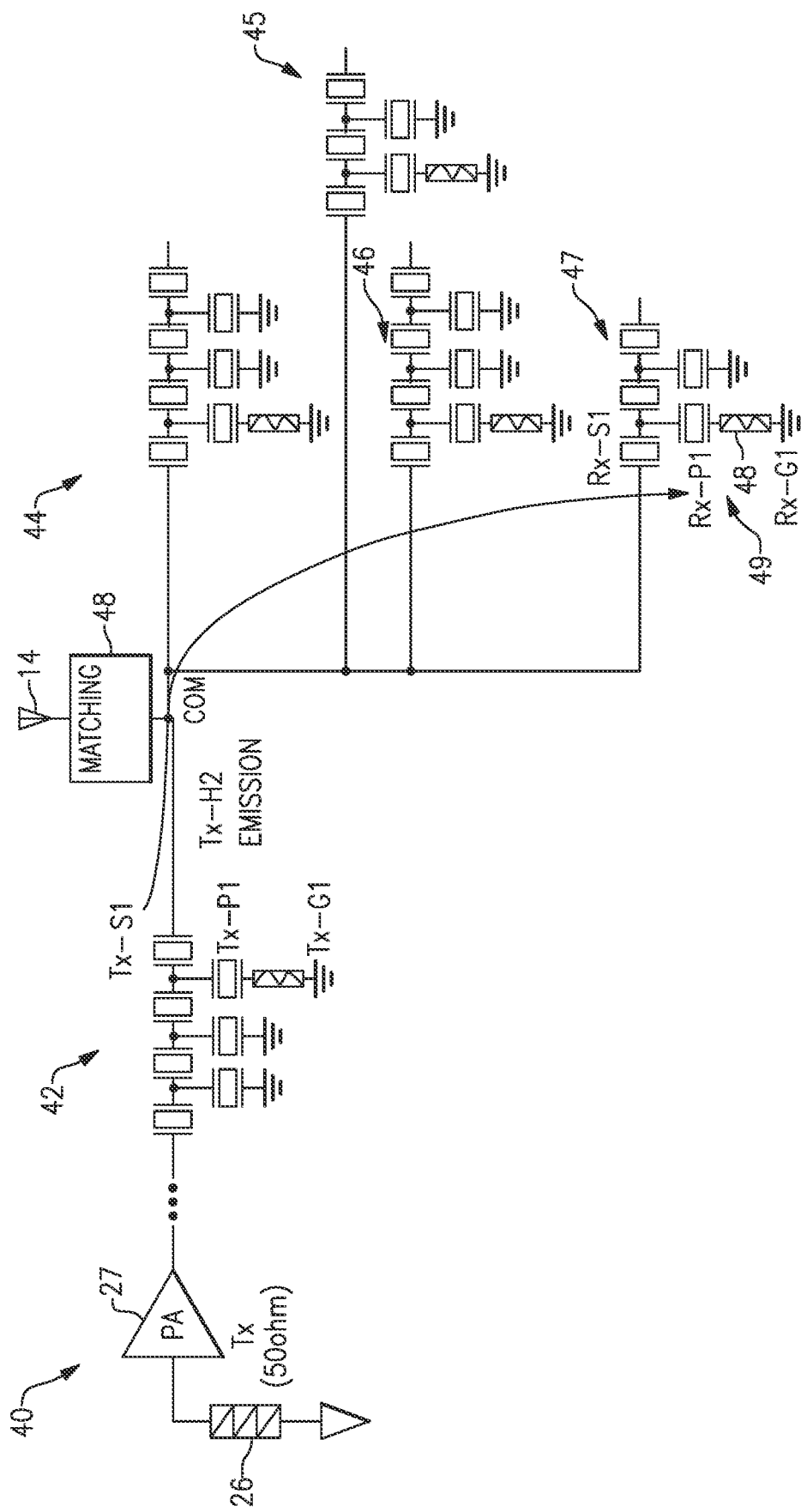
FIG. 4 is a schematic diagram of a multiplexer with an acoustic assisted trap circuit according to an embodiment.

FIG. 4 is a schematic diagram of a radio frequency system 40 that includes a multiplexer with an acoustic assisted trap circuits according to an embodiment. The illustrated multiplexer includes acoustic wave filters 42, 44, 45, 46, and 47. The acoustic wave filters 42, 44, 45, 46, and 47 are coupled together at a common node COM. A matching circuit 28 is coupled between the common node COM and an antenna 14.

In the radio frequency system 40, a power amplifier 27 can provide an amplified radio frequency (RF) signal to acoustic wave filter 42. The acoustic wave filter 42 is a transmit filter. As one example, the acoustic wave filter 42 can be a Band 3 transmit filter. The series acoustic wave resonator Tx-S1 can generate H2. The series acoustic wave resonator Tx-S1 can be a BAW resonator in certain applications. The BAW resonator can be a film bulk acoustic wave resonator (FBAR). Alternatively, the BAW resonator can be a BAW solidly mounted resonator (SMR). BAW resonators can generate more H2 than other types of acoustic wave resonators, such as SAW resonators. The series acoustic wave resonator Tx-S1 can provide the largest H2 of any acoustic wave resonator of the acoustic wave filter 42.

An acoustic assisted trap circuit 49 of the acoustic wave filter 47 can trap H2 generated by the acoustic wave filter 42 to reduce current associated with the H2 of the acoustic wave filter 42 from going to the antenna 14. The acoustic assisted trap circuit 49 includes a shunt acoustic wave resonator Rx-P1 and an impedance network 48 in series with the shunt acoustic wave resonator Rx-P1. The acoustic assisted trap circuit 49 can provide an open circuit at a fundamental frequency of the series acoustic wave resonator Tx-S1 and also provide a short circuit at a second harmonic of the series acoustic wave resonator Tx-S1. The impedance network 48 can include one or more suitable passive impedance elements. For example, the impedance network 48 can be or include an inductor. Such an inductor can be implemented on the same die as the acoustic wave filter 47. The inductor can be a surface mount inductor. The inductor can be an integrated passive device (IPD) inductor. The inductor can include a conductive trace of a substrate and/or a wire bond. The inductor can be any other suitable inductor.

The shunt acoustic wave resonator Rx-P1 can be implemented on a different die than the series acoustic wave resonator Tx-S1. The shunt acoustic wave resonator Rx-P1 can be a different type of acoustic wave resonator than the series acoustic wave resonator Tx-51. For example, the shunt acoustic wave resonator Rx-P1 can be a SAW resonator, such as a temperature compensated SAW (TCSAW) resonator or multilayer piezoelectric substrate (MPS) SAW resonator, and the series acoustic wave resonator Tx-S1 can be a BAW resonator. The acoustic wave filter 47 can be a receive filter in certain applications. Alternatively, a harmonic trap circuit for reducing H2 associated with the acoustic wave filter 42 at the antenna 14 can be included in a transmit filter. A harmonic trap circuit can be included in an acoustic wave filter configured as both a transmit filter and a receive filter.

The shunt acoustic wave resonator Rx-P1 can have a fundamental frequency that is farther from the harmonic associated with the acoustic wave filter 42 than a corresponding shunt acoustic wave resonator of any other filter 44, 45, or 46 of the multiplexer. This can correspond to the acoustic wave filter 47 having an edge of a passband that is farther from the harmonic associated with the acoustic wave filter 42 than a corresponding edge of a passband of any other filter 44, 45, or 46. With a larger difference between fundamental frequency and a harmonic, it can be easier to implement the acoustic assisted trap circuit 49 for reducing H2 of the acoustic wave filter 42 at the antenna 14.

One or more of the acoustic wave filters 42, 44, 45, and 46 can include a harmonic trap circuit to reduce H2 associated with another acoustic wave filter provided to the antenna 14. The acoustic wave filter 47 can alternatively or additionally include a harmonic trap circuit to reduce H2 associated with another filter of the multiplexer. A trap circuit of any suitable acoustic wave filter of the multiplexer of the radio frequency system 40 can be implemented in accordance with any suitable principles and advantages of the acoustic assisted trap circuit 49. A harmonic trap circuit can be implemented in an acoustic wave filter with a band edge hat has a greatest frequency difference from the second harmonic that is trapped by the harmonic trap circuit. In certain applications, a harmonic trap circuit can be implemented in an acoustic wave filter with a passband that has a greatest frequency difference from the second harmonic that is trapped by the harmonic trap circuit. With a greater frequency difference between the passband and the second harmonic being trapped, it can be easier to implement the impedance network of the trap circuit for trapping the second harmonic without significantly affecting the passband of the acoustic wave filter that includes the trap circuit.

Figure 5:
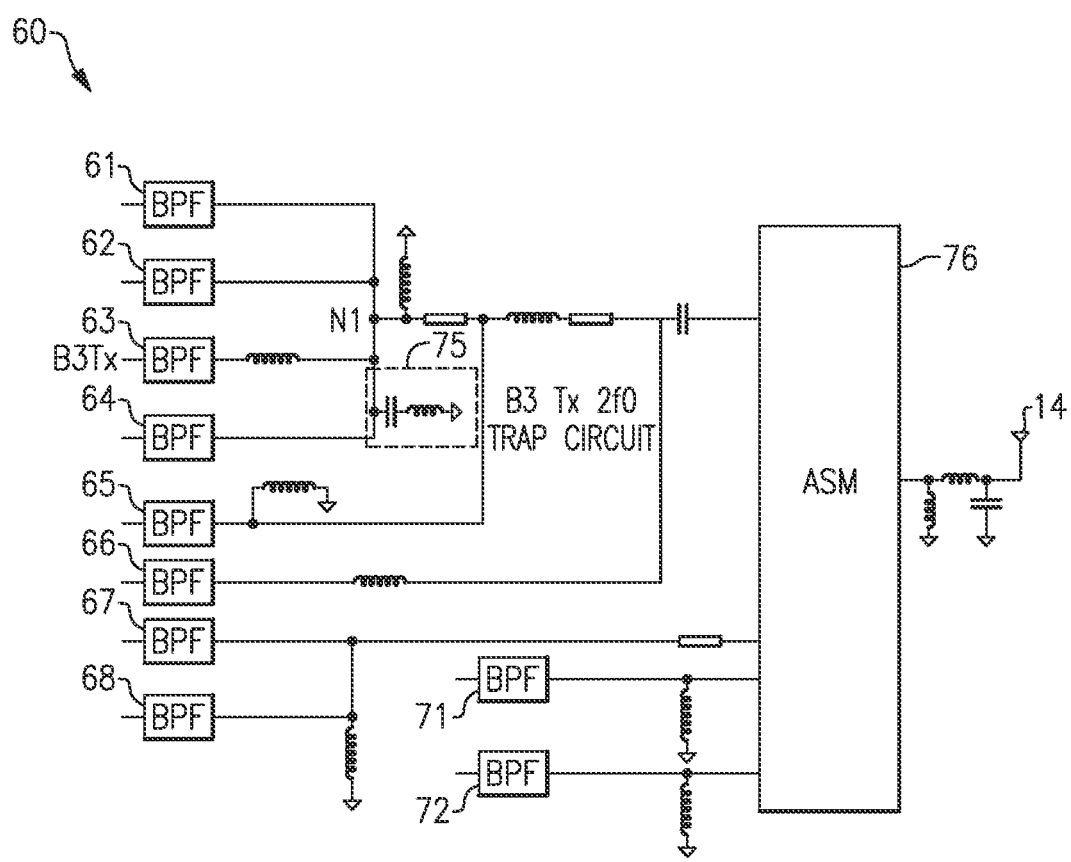
FIG. 5 is a schematic diagram of a radio frequency system with an inductor capacitor trap circuit according to an embodiment.

FIG. 5 is a schematic diagram of a radio frequency system 60 with an inductor capacitor trap circuit 75 according to an embodiment. The radio frequency system 60 includes a plurality of band pass filters 61, 62, 63, 64, 65, 66, 67, 68, 71, and 72. Some or all of these filters can be acoustic wave filters. The band pass filter 63 is an acoustic wave filter that generates an H2 emission. The band pass filter 63 can be a transmit filter. As one example, the band pass filter 63 can be a Band 3 transmit filter. The band pass filter 63 can alternatively be a transmit filter for transmitting one or more other radio frequency bands. The radio frequency system 60 also includes a plurality of passive impedance elements including inductors and capacitors.

The radio frequency system 60 includes an inductor capacitor trap circuit 75 that is coupled to a node N1 at which the band pass filters 61, 62, 63, and 64 are coupled to each other. The inductor capacitor trap circuit 75 is configured to trap H2 emissions generated by the band pass filter 63. The inductor capacitor trap circuit 75 can reduce such H2 emissions from a signal path that includes the band pass filter 63 at the antenna 14. As illustrated, the inductor capacitor trap circuit 75 can include a shunt circuit with an inductor in series with the shunt capacitor. The inductor capacitor trap circuit 75 can include one or more suitable inductors and one or more suitable capacitors. As one example, the inductor capacitor trap circuit 75 can include a surface mount inductor and a surface mount capacitor. The inductor capacitor trap circuit 75 can include one or more surface mount inductors, one or more integrated passive device inductors on an integrated passive device die, one or more inductors that include a conductive trace of the substrate and/or a wire bond, one or more inductors implemented on an acoustic wave device die, or any suitable combination thereof. The inductor capacitor trap circuit 75 can include one or more surface mount capacitors, one or more integrated passive device capacitors on an integrated passive device die, one or more capacitors implemented on an acoustic wave device die, or any suitable combination thereof.

An antenna switch module 76 is coupled in a signal path between the band pass filter 63 and the antenna 14. The antenna switch module 76 includes an antenna switch. The inductor capacitor trap circuit 75 is coupled to a node in a signal path between the band pass filter 63 and the antenna switch. With the inductor capacitor trap circuit 75 coupled to a node between the band pass filter 63 and the antenna switch, stronger H2 emission trapping can be achieved relative to a similar inductor capacitor trap circuit coupled to a node between the antenna switch module 76 and the antenna 14. This can help meet stringent system level H2 emission specifications. With the inductor capacitor trap circuit 75 coupled to a node between the band pass filter 63 and the antenna switch module 76, the inductor capacitor trap circuit 75 can be specifically configured to trap H2 associated with the band pass filter 63. The inductor capacitor trap circuit 75 can trap H2 associated with the band pass filter 63 without significantly changing impedance at a fundamental frequency associated with any of the band pass filters of the radio frequency system 60.

FIGS. 6A and 6B are Smith charts associated with the radio frequency system 60 of FIG. 5. FIG. 6A is a Smith chart that indicates similar fundamental frequency performance whether or not the inductor capacitor trap circuit 75 is included in a radio frequency system 60. FIG. 6B is a Smith chart indicating that including the inductor capacitor trap circuit 75 provides a second harmonic trap for the band pass filter 63, where the band pass filter 63 is a Band 3 transmit filter.

Figure 7A:
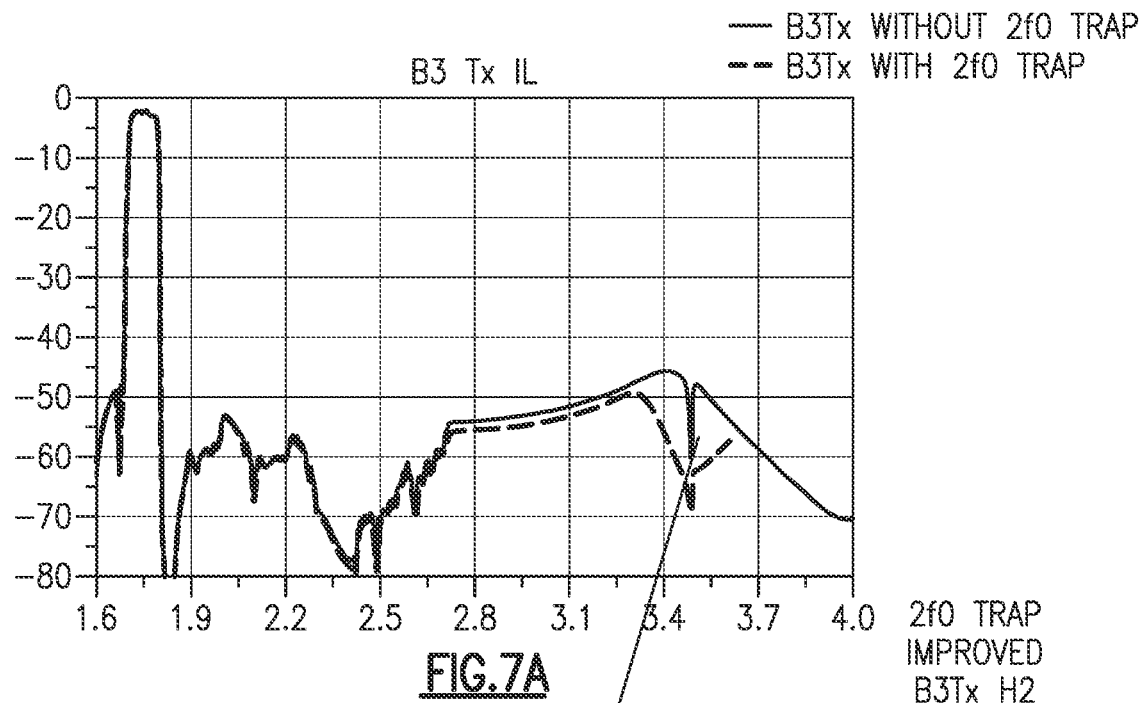
FIGS. 7A and 7B are graphs of insertion loss and H2 associated with an acoustic wave filter of the radio frequency system of FIG. 5.
Figure 7B:
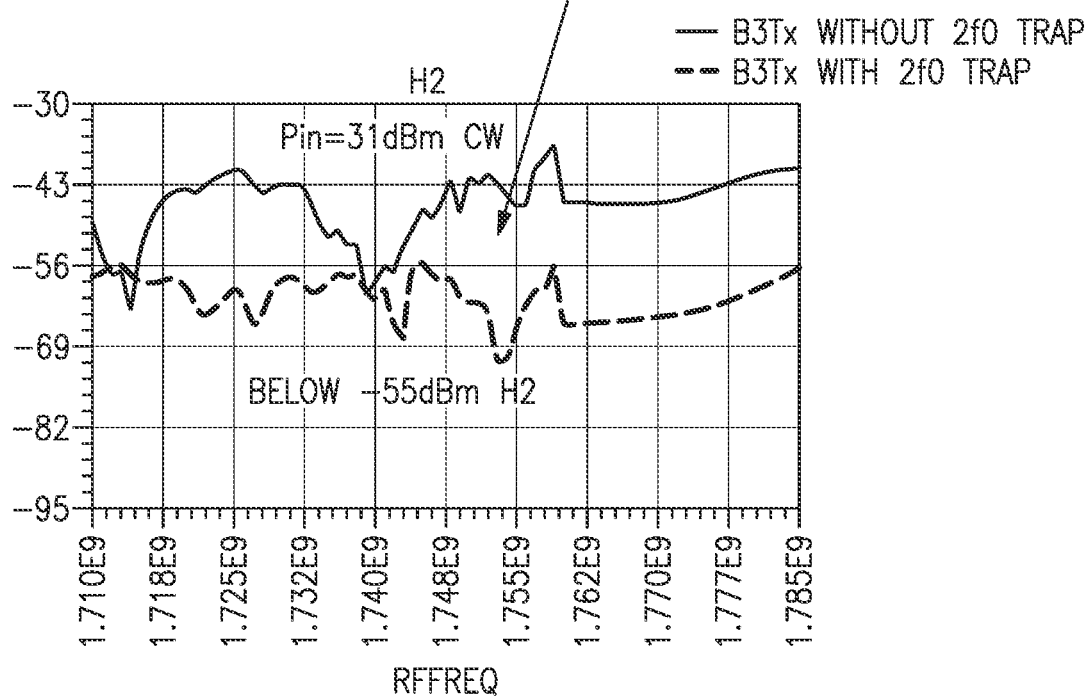

FIGS. 7A and 7B are graphs of insertion loss and H2 associated with the band pass filter 63 of the radio frequency system 60 of FIG. 5. In these simulations, the band pass filter 63 is a Band 3 transmit filter that includes BAW resonators. FIG. 7A shows stronger rejection in the frequency response of the band pass filter 63 at a second harmonic that is provided by the inductor capacitor trap circuit 75. FIG. 7B shows reduced H2 provided by the inductor capacitor trap circuit 75. This indicates that the inductor capacitor trap circuit 75 is effective as a trap circuit. H2 is below −55 dBm in FIG. 7B with the inductor capacitor trap circuit 75.

Figure 8:
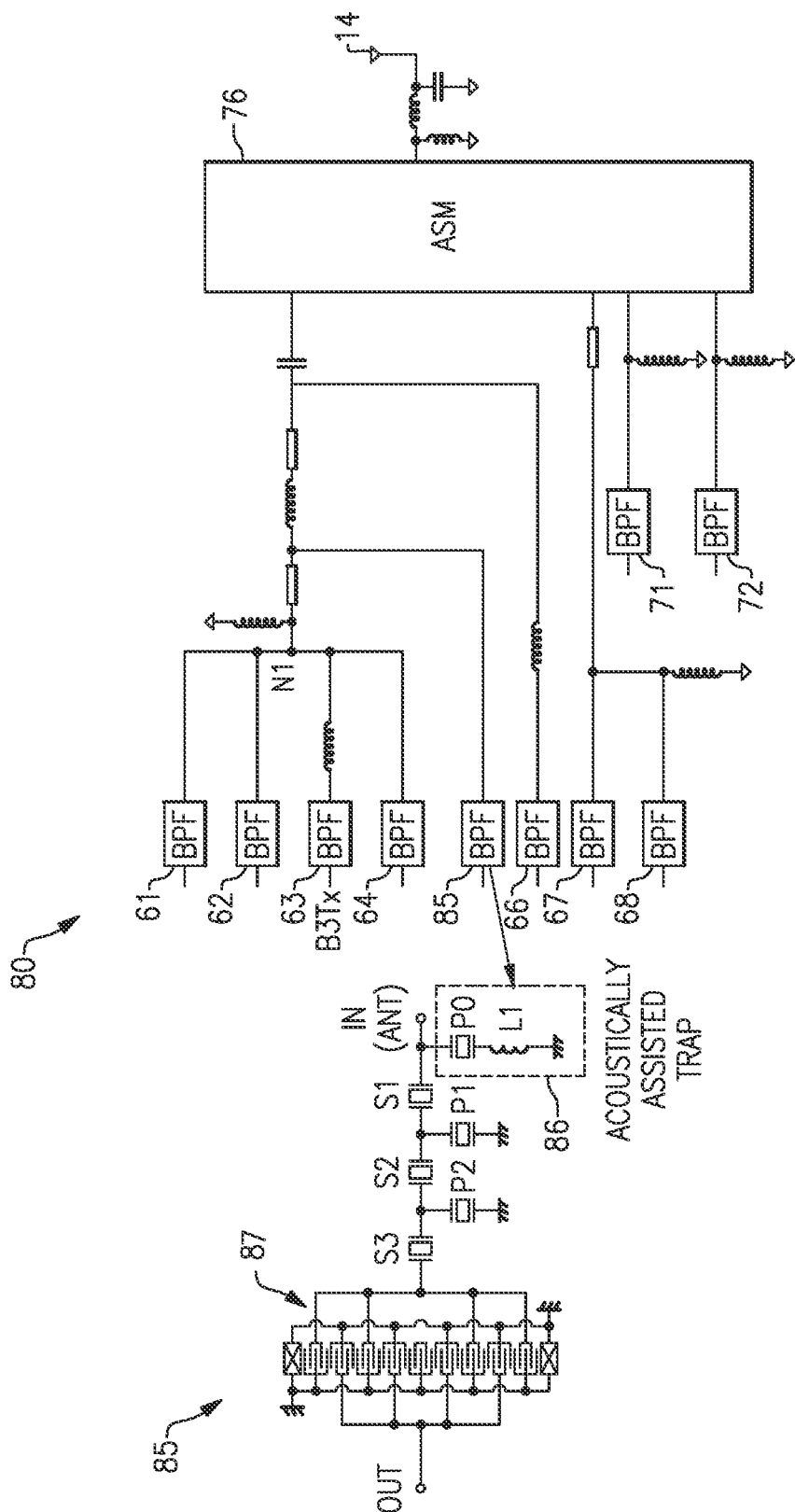
FIG. 8 is a schematic diagram of a radio frequency system with an acoustic assisted trap circuit according to an embodiment.

FIG. 8 is a schematic diagram of a radio frequency system 80 with an acoustic assisted trap circuit 86 according to an embodiment. The radio frequency system 80 is similar to the radio frequency system 60 of FIG. 5, except that that a second harmonic trap circuit for the band pass filter 63 is implemented by an acoustic assisted trap circuit 86 of a band pass filter 85 in the radio frequency system 80 instead of the inductor capacitor trap circuit 75. In addition, the radio frequency system 80 includes band pass filter 85 in place of the band pass filter 65 of the radio frequency system 60.

As illustrated in FIG. 8, the band pass filter 85 includes the acoustic assisted trap circuit 86. The acoustic assisted trap circuit 86 includes a shunt acoustic wave resonator P0 in series with an inductor L1. One or more other suitable passive impedance element(s) can alternatively or additionally be implemented to create a second harmonic trap with the shunt acoustic wave resonator P0. The band pass filter 85 can be the filter of a multiplexer with the largest difference between an edge of its passband and the H2 emission generated by the band pass filter 63. This can simplify the design of the acoustic assisted trap circuit 86 and/or result in less impact on impedance at a fundamental frequency. As one example, the band pass filter 85 can be a Band 32 receive filter and the band pass filter 63 can be a Band 3 transmit filter. As another example, the band pass filter 85 can be a Band n75 receive filter and the band pass filter 63 can be a Band 3 transmit filter. The band pass filter 85 can be a receive filter, a transmit filter, or a filter arranged as a transmit and receive filter.

The band pass filter 85 can include a plurality of acoustic wave resonators P0, P1, P2, S1, S2, and S3 and a multi-mode SAW filter 87 as illustrated. The plurality of acoustic wave resonators P0, P1, P2, S1, S2, and S3 can include one or more SAW resonators and/or one or more BAW resonators.

The shunt acoustic wave resonator P0 can cause and/or contribute to the acoustic assisted trap circuit 86 providing a steeper frequency response than the inductor capacitor trap circuit 75. The acoustic assisted trap circuit 86 can be implemented in less additional module area compared to the inductor capacitor trap circuit 75 in certain applications. The shunt acoustic wave resonator P0 can be implemented on a different die than acoustic wave resonators of the band pass filter 63. This can be due to differences in resonator stacks for creating different resonant frequencies for the shunt inductor P0 and the series resonator of the band pass filter 63 closest to antenna 14. The shunt acoustic wave resonator P0 can be implemented on a different die than acoustic wave resonators of the band pass filter 63 when the shunt acoustic wave resonator P0 is a different type of acoustic wave resonator than the acoustic wave resonators of the band pass filter 63. In certain applications, the shunt acoustic wave resonator P0 is a SAW resonator and the series acoustic wave of the band pass filter 63 closest to the antenna 14 can be a BAW resonator. For example, the shunt acoustic wave resonator P0 can be TCSAW resonator, a non-temperature compensated SAW resonator, or multilayer piezoelectric substrate (MPS) SAW resonator. In certain applications, the shunt acoustic wave resonator P0 is a TCSAW resonator. In some other applications, the shunt acoustic wave resonator P0 is a BAW resonator and the series acoustic wave of the band pass filter 63 closest to the antenna 14 can be a BAW resonator.

FIGS. 9A and 9B are Smith charts associated with the band pass filter 85 the radio frequency system 80 of FIG. 8. FIG. 9A is a Smith chart that indicates similar fundamental frequency performance whether or not the acoustic assisted trap circuit 86 is included in the band pass filter 85. FIG. 9B is a Smith chart indicating that including the acoustic assisted trap circuit 86 provides a second harmonic trap for the band pass filter 63, where the band pass filter 63 is a Band 3 transmit filter.

Figure 10A:
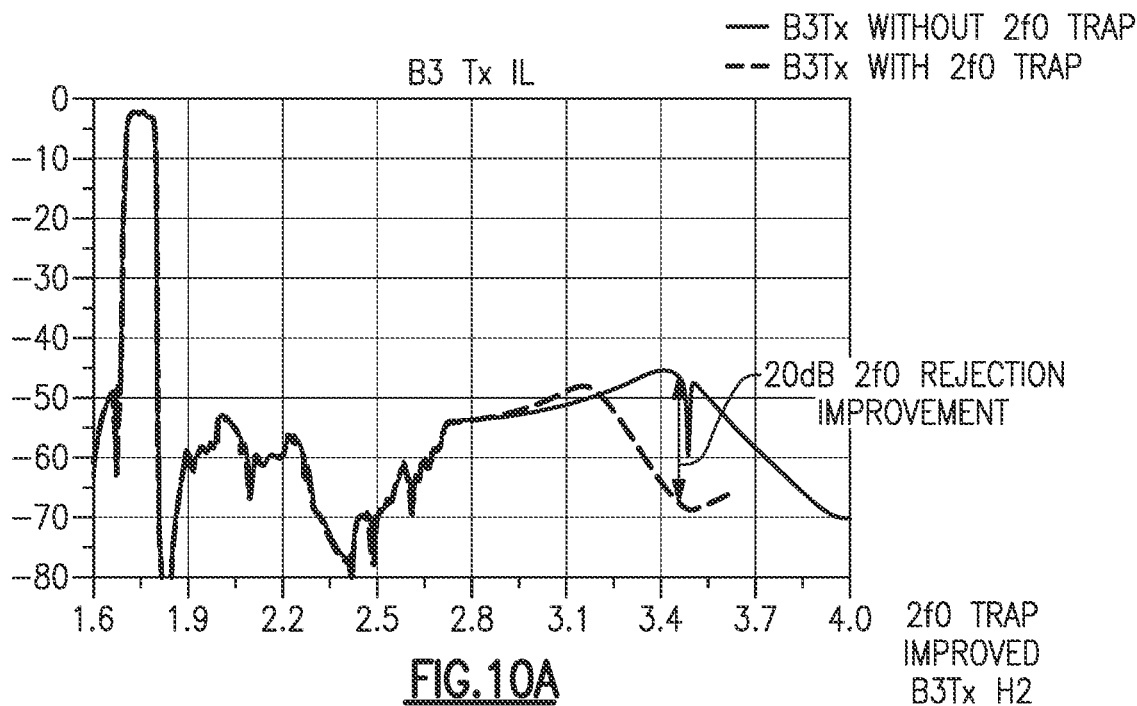
FIGS. 10A and 10B are graphs of insertion loss and H2 associated with an acoustic wave filter of the radio frequency system of FIG. 5.
Figure 10B:
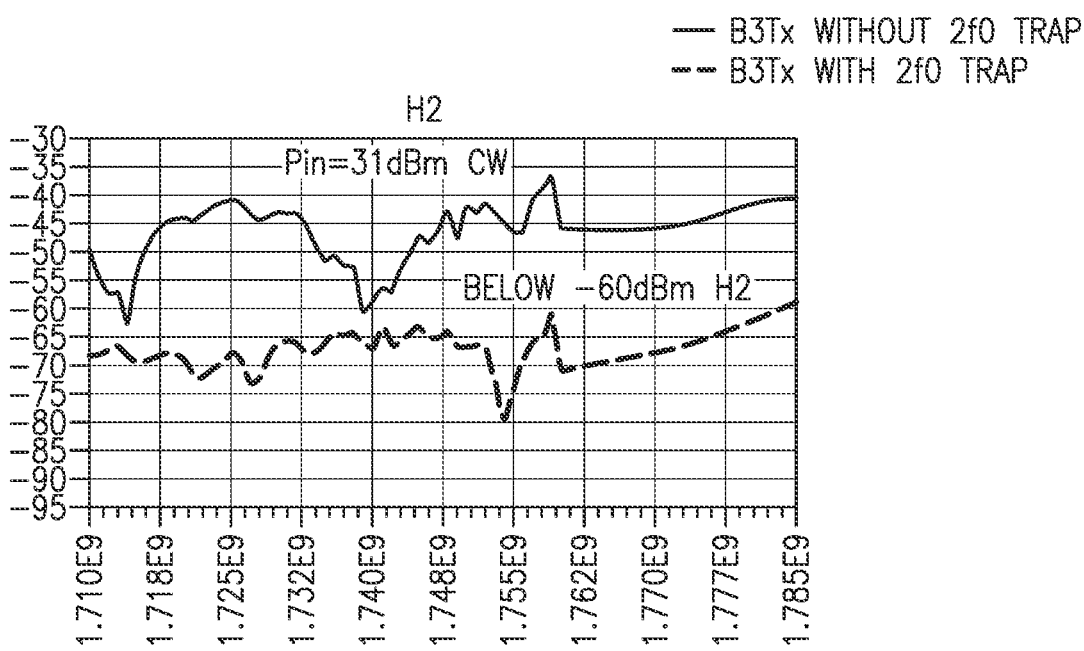

FIGS. 10A and 10B are graphs of insertion loss and H2 associated with the band pass filter 63 of the radio frequency system 80 of FIG. 5. In these simulations, the band pass filter 63 is a Band 3 transmit filter that includes BAW resonators. FIG. 10A shows stronger rejection in the frequency response of the band pass filter 63 at a second harmonic provided by the acoustic assisted trap circuit 86. FIG. 10B shows reduced H2 provided by the acoustic assisted trap circuit 86. This indicates that the acoustic assisted trap circuit 86 is effective as a trap circuit. H2 is below −60 dBm in FIG. 10B with the acoustic assisted trap circuit 86.

In the radio frequency system 80, one or more of the band pass filters 61, 62, 63, 64, 66, 67, 68, 71, and 72 can include an acoustic assisted trap circuit for trapping an H2 emission associated with another filter.

One or more harmonic trap circuits in accordance with any suitable principles and advantages disclosed herein can be configured to trap a harmonic associated with a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. One or more harmonic trap circuits in accordance with any suitable principles and advantages disclosed herein can be configured to trap a harmonic associated with a radio frequency signal in a fourth generation (4G) Long Term Evolution (LTE) operating band. One or more harmonic trap circuits in accordance with any suitable principles and advantages disclosed herein can be configured to trap a harmonic associated with a radio frequency signal in a wireless local area network band, such as a Wi-Fi band. Although harmonic trap circuits disclosed herein may be discussed with reducing power of a second harmonic at an antenna, any suitable principles and advantages disclosed herein can be applied to harmonic trap circuits arranged to trap any other suitable harmonic, such as a third harmonic.

Figure 11:
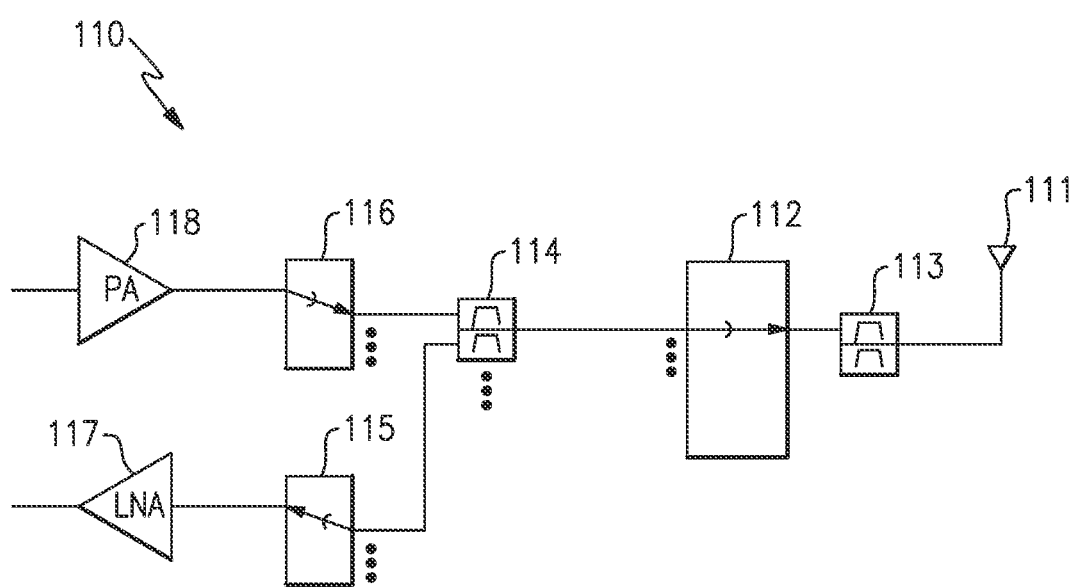
FIG. 11 is a schematic diagram of a radio frequency system with a multiplexer according to an embodiment.

Harmonic trap circuits disclosed herein can be implemented in radio frequency systems. FIG. 11 is a schematic diagram of an example radio frequency system 110 with a multiplexer according to an embodiment. As illustrated, the radio frequency system 110 includes an antenna 111, an antenna switch 112, an antenna-plexer 113 connected between the antenna 111 and the antenna switch 112, at least one multiplexer 114, a receive switch 115, a transmit switch 116, a low noise amplifier 117, and a power amplifier 118. The multiplexer 114 can include one or more harmonic trap circuits in accordance with any suitable principles and advantages disclosed herein. Although the multiplexer 114 is illustrated as including two filters, the multiplexer 114 can include any suitable number of filters for a particular application. The antenna-plexer 113 can include one or more harmonic trap circuits in accordance with any suitable principles and advantages disclosed herein.

In the radio frequency system 110, the antenna 111 can transmit and receive RF signals. The antenna-plexer 113 can provide frequency domain multiplexing for signals propagating between the antenna 111 and radio frequency signal paths. One such radio frequency signal path includes the antenna switch 112. The antenna switch 112 can selectively electrically connect a multiplexer or a standalone filter to the antenna-plexer 113. As illustrated, the antenna switch 112 can selective electrically connect the multiplexer 114 to the antenna-plexer 113. The multiplexer 114 includes a receive filter configured to filter a radio frequency signal received by the antenna 111 and to provide a filtered radio frequency signal to the low noise amplifier 117 via a receive switch 115. The low noise amplifier 117 can amplify the filtered radio frequency signal. The multiplexer 114 also includes a transmit filter configured to filter a radio frequency signal generated by the power amplifier 118 for transmission by the antenna 111. The power amplifier 118 can amplify a radio frequency signal. The transmit switch 116 can connect the power amplifier 118 to the transmit filter of the multiplexer 114.

Figure 12:
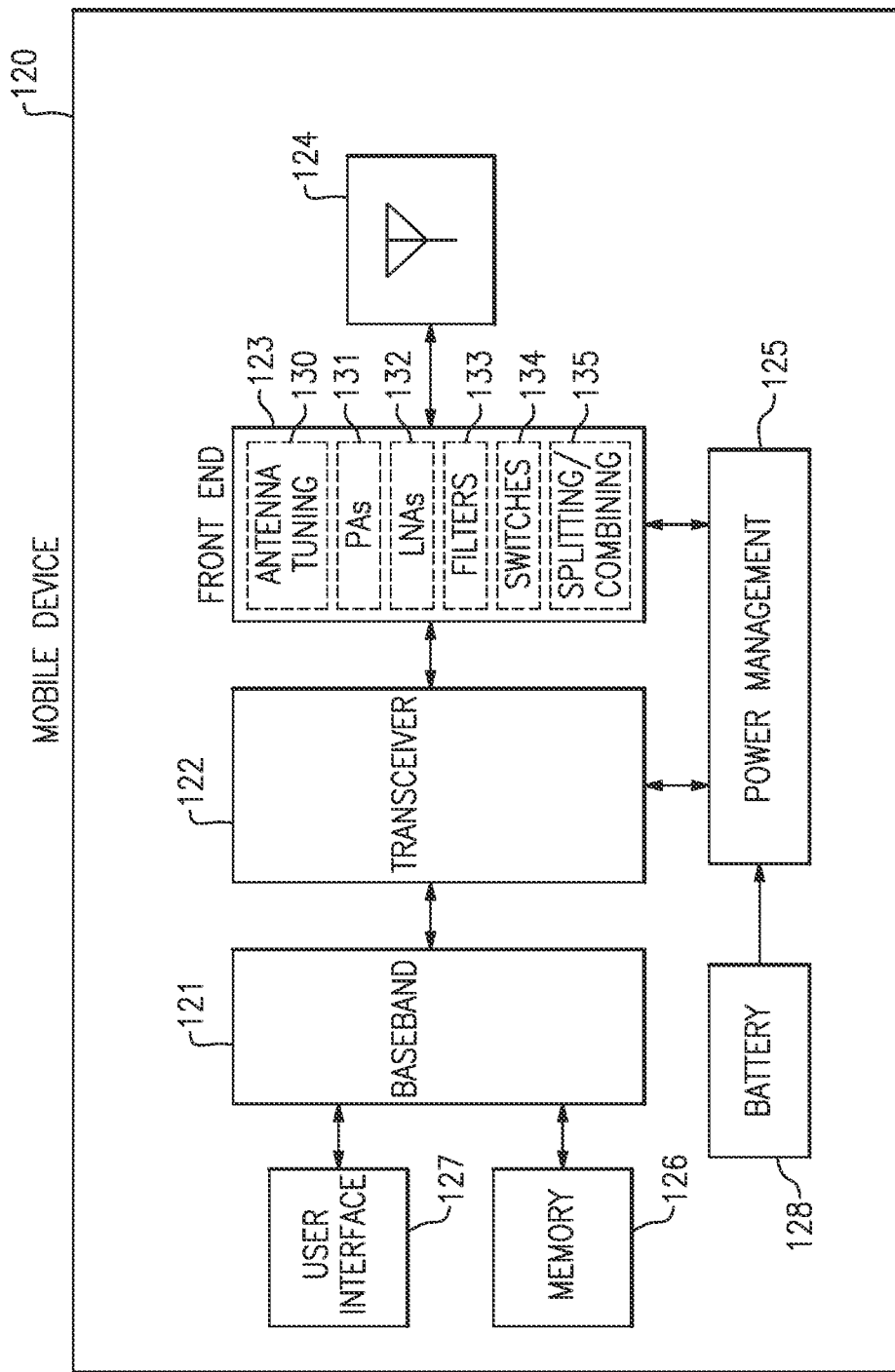
FIG. 12 is a schematic block diagram of a wireless communication device that includes a filter according to an embodiment.

Harmonic trap circuits disclosed herein can be implemented in wireless communication devices. FIG. 12 is a schematic block diagram of a wireless communication device 120 that includes a harmonic trap circuit according to an embodiment. The wireless communication device 120 can be a mobile device. The wireless communication device 120 can be any suitable wireless communication device. For instance, a wireless communication device 120 can be a mobile phone, such as a smart phone. As illustrated, the wireless communication device 120 includes a baseband system 121, a transceiver 122, a front end system 123, one or more antennas 124, a power management system 125, a memory 126, a user interface 127, and a battery 128.

The wireless communication device 120 can communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 122 generates RF signals for transmission and processes incoming RF signals received from the antennas 124. Various functionalities associated with the transmission and receiving of RF signals can be achieved by one or more components that are collectively represented in FIG. 12 as the transceiver 122. In one example, separate components (for instance, separate circuits or dies) can be provided for handling certain types of RF signals.

The front end system 123 aids in conditioning signals provided to and/or received from the antennas 124. In the illustrated embodiment, the front end system 123 includes antenna tuning circuitry 130, power amplifiers (PAs) 131, low noise amplifiers (LNAs) 132, filters 133, switches 134, and signal splitting/combining circuitry 135. However, other implementations are possible. The front end system 123 can include one or more harmonic trap circuits in accordance with any suitable principles and advantages disclosed herein. For example, the filters 133 can include one or more acoustic assisted trap circuits in accordance with any suitable principles and advantages disclosed herein.

The front end system 123 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 120 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 124 can include antennas used for a wide variety of types of communications. For example, the antennas 124 can include antennas for transmitting and/or receiving signals associated with a wide variety of frequencies and communications standards.

In certain implementations, the antennas 124 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 120 can operate with beamforming in certain implementations. For example, the front end system 123 can include amplifiers having controllable gain and phase shifters having controllable phase to provide beam formation and directivity for transmission and/or reception of signals using the antennas 124. For example, in the context of signal transmission, the amplitude and phases of the transmit signals provided to the antennas 124 are controlled such that radiated signals from the antennas 124 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 124 from a particular direction. In certain implementations, the antennas 124 include one or more arrays of antenna elements to enhance beamforming.

The baseband system 121 is coupled to the user interface 127 to facilitate processing of various user input and output (I/O), such as voice and data. The baseband system 121 provides the transceiver 122 with digital representations of transmit signals, which the transceiver 122 processes to generate RF signals for transmission. The baseband system 121 also processes digital representations of received signals provided by the transceiver 122. As shown in FIG. 12, the baseband system 121 is coupled to the memory 126 of facilitate operation of the wireless communication device 120.

The memory 126 can be used for a wide variety of purposes, such as storing data and/or instructions to facilitate the operation of the wireless communication device 120 and/or to provide storage of user information.

The power management system 125 provides a number of power management functions of the wireless communication device 120. In certain implementations, the power management system 125 includes a PA supply control circuit that controls the supply voltages of the power amplifiers 131. For example, the power management system 125 can be configured to change the supply voltage(s) provided to one or more of the power amplifiers 131 to improve efficiency, such as power added efficiency (PAE).

As shown in FIG. 12, the power management system 125 receives a battery voltage from the battery 128. The battery 128 can be any suitable battery for use in the wireless communication device 120, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz or in a frequency range from about 400 MHz to 5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer with an acoustic assisted trap circuit, the multiplexer comprising:
   a first acoustic wave filter including a bulk acoustic wave resonator; and
   a second acoustic wave filter coupled to the first acoustic wave filter, the second acoustic wave filter including a surface acoustic wave resonator and an impedance network, the surface acoustic wave resonator and the impedance network together configured to provide a trap for a harmonic associated with the first acoustic wave filter, the trap providing a short circuit to ground at a frequency of the harmonic associated with the first acoustic wave filter.

2. The multiplexer of claim 1 wherein the surface acoustic wave resonator is a temperature compensated surface acoustic wave resonator.

3. The multiplexer of claim 1 wherein the impedance network includes an inductor.

4. The multiplexer of claim 3 wherein the surface acoustic wave resonator is a shunt resonator in series with the inductor.

5. The multiplexer of claim 4 wherein the surface acoustic wave resonator is a first acoustic wave resonator of the second acoustic wave filter from a common node at which the first acoustic wave filter is coupled to the second acoustic wave filter.

6. The multiplexer of claim 4 wherein the second acoustic wave filter includes a series acoustic wave resonator coupled between the surface acoustic wave resonator and a common node at which the first acoustic wave filter is coupled to the second acoustic wave filter.

7. The multiplexer of claim 3 wherein the inductor is on a same die as the surface acoustic wave resonator.

8. The multiplexer of claim 1 wherein the first acoustic wave filter is a transmit filter, and the second acoustic wave filter is a receive filter.

9. The multiplexer of claim 1 wherein the first acoustic wave filter is a transmit filter, and the second acoustic wave filter is a transmit filter.

10. The multiplexer of claim 1 wherein the first acoustic wave filter and the second acoustic wave filter are both band pass filters, and the first acoustic wave filter and the second acoustic wave filter are associated with different frequency bands.

11. The multiplexer of claim 1 further comprising a plurality of additional acoustic wave filters coupled to the first and second acoustic wave filters at a common node, the second acoustic wave filter being associated with a fundamental frequency that is farther from the harmonic than a respective fundamental frequency associated with any of the plurality of additional acoustic wave filters.

12. The multiplexer of claim 1 wherein the harmonic is a second harmonic.

13. The multiplexer of claim 12 wherein the multiplexer is included in a radio frequency system that achieves −90 dBc or less for the harmonic.

14. A radio frequency system comprising:
   a power amplifier;
   an antenna switch; and
   a multiplexer including a first acoustic wave filter and a second acoustic wave filter coupled to the first acoustic wave filter, the first acoustic wave filter including a bulk acoustic wave resonator, and the second acoustic wave filter including a surface acoustic wave resonator and an impedance network, the surface acoustic wave resonator and the impedance network are together configured to provide a trap for a harmonic associated with the first acoustic wave filter, the trap providing a short circuit to ground at a frequency of the harmonic associated with the first acoustic wave filter, and the first acoustic wave filter being in a signal path between the power amplifier and the antenna switch.

15. The radio frequency system of claim 14 further comprising a low noise amplifier, the second acoustic wave filter being in a signal path between the low noise amplifier and the antenna switch.

16. The radio frequency system of claim 14 wherein the second acoustic wave filter is a transmit filter.

17. The radio frequency system of claim 14 wherein the radio frequency system is configured to achieve less than −90 dBc for the harmonic at an antenna side node of the antenna switch.

18. A wireless communication device comprising:
 a multiplexer including a first acoustic wave filter and a second acoustic wave filter coupled to the first acoustic wave filter, the first acoustic wave filter including a bulk acoustic wave resonator, and the second acoustic wave filter including a surface acoustic wave resonator and an impedance network, the surface acoustic wave resonator and the impedance network are together configured to provide a trap for a harmonic associated with the first acoustic wave filter, the trap providing a short circuit to ground at a frequency of the harmonic associated with the first acoustic wave filter; and
 an antenna operatively coupled to the multiplexer.

19. The wireless communication device of claim 18 further comprising a power amplifier, the first acoustic wave filter configured to filter a radio frequency signal generated by the power amplifier.

20. The wireless communication device of claim 18 wherein the wireless communication device is a mobile phone.

* * * * *